(12) United States Patent
Taddiken et al.

(10) Patent No.: US 10,804,354 B2
(45) Date of Patent: Oct. 13, 2020

(54) RADIO FREQUENCY RESISTOR ELEMENT (71) Applicant: Infineon Technologies AG, Neubiberg (DE)

(72) Inventors: Hans Taddiken, Munich (DE); Martin Bartels, Dresden (DE); Andrea Cattaneo, Taufkirchen (DE); Henning Feick, Dresden (DE); Christian Kuehn, Munich (DE); Anton Steltenpohl, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 118 days.

(21) Appl. No.: 15/933,998

(22) Filed: Mar. 23, 2018

(65) Prior Publication Data

US 2018/0286941 A1    Oct. 4, 2018

(30) Foreign Application Priority Data

Mar. 30, 2017    (DE) .................. 10 2017 205 448

(51) Int. Cl.
| | |
|---|---|
| *H01L 23/66* | (2006.01) |
| *H01L 49/02* | (2006.01) |
| *H01L 27/06* | (2006.01) |
| *H01L 23/522* | (2006.01) |

(52) U.S. Cl.
CPC .............. *H01L 28/20* (2013.01); *H01L 23/66* (2013.01); *H01L 27/0641* (2013.01); *H01L 23/5228* (2013.01); *H01L 2924/1421* (2013.01)

(58) Field of Classification Search
CPC combination set(s) only.
See application file for complete search history.

(56) References Cited

U.S. PATENT DOCUMENTS

| | | | |
|---|---|---|---|
| 6,040,225 A | 3/2000 | Boles | |
| 2008/0206939 A1* | 8/2008 | Min | ................... H01L 27/0629 438/197 |
| 2014/0167182 A1 | 6/2014 | Nandakumar et al. | |
| 2015/0187757 A1 | 7/2015 | Chung et al. | |
| 2015/0221642 A1 | 8/2015 | Liaw | |
| 2016/0329891 A1 | 11/2016 | Bakalski et al. | |
| 2017/0256535 A1* | 9/2017 | Nandakumar | ...... H01L 27/0635 |
| 2019/0206980 A1* | 7/2019 | Jan | ................... C23C 16/45525 |

* cited by examiner

*Primary Examiner* — Moazzam Hossain
*Assistant Examiner* — Hajar Kolahdouzan
(74) *Attorney, Agent, or Firm* — Slater Matsil, LLP (57) ABSTRACT

A radio frequency resistor element comprises a resistive polysilicon trace, an isolation component and a semiconductor substrate. The resistive polysilicon trace is located above the isolation component. The isolation component is laterally at least partially surrounded by a modified semiconductor region located above the semiconductor substrate and having a higher charge carrier recombination rate than the semiconductor substrate.

20 Claims, 5 Drawing Sheets

RADIO FREQUENCY RESISTOR ELEMENT

This application claims the benefit of German Application No. 10 2017 205 448.4, filed on Mar. 30, 2017, which application is hereby incorporated herein by reference in its entirety.

TECHNICAL FIELD

The disclosure relates in general to elements and more particularly to a radio frequency resistor element.

BACKGROUND

Multi-throw radio frequency switches have usually multiple inputs and a shared output. They are used, for example, in cellular phones to enable operation at more than one frequency. Unfortunately, radio frequency switches are prone to generating harmonics. Such non-linear behavior is tried to be avoided as the harmonics are either emitted or induced into received signals.

SUMMARY

In an embodiment, a radio frequency resistor element comprises a resistive polysilicon trace, an isolation component and a semiconductor substrate. The resistive polysilicon trace is located above the isolation component. The isolation component is laterally at least partially surrounded by a modified semiconductor region. The modified semiconductor region has a higher charge carrier recombination rate than the semiconductor substrate located below the isolation component.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the disclosure, and do not limit the scope.

Figure 1:
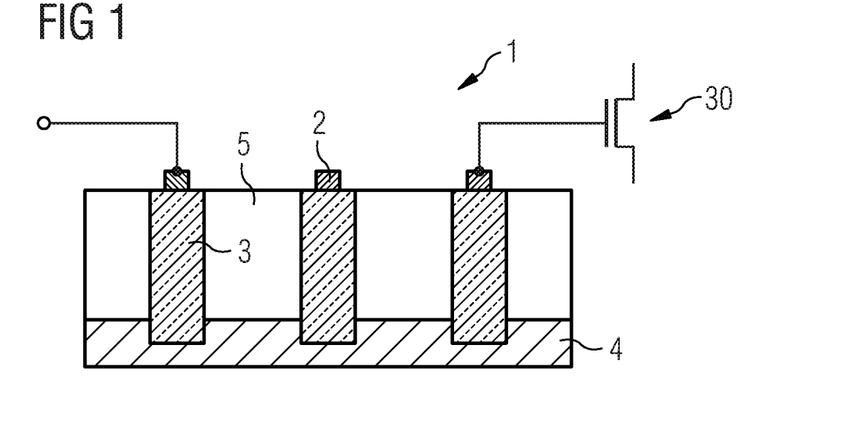
FIG. 1 shows a schematic section of a first embodiment of a radio frequency resistor element as a part of a radio frequency switch.

FIG. 1 shows an embodiment of a radio frequency resistor element 1 as a part of a radio frequency switch. The radio frequency resistor element 1 serves as a series resistor (usually with a resistance value of about 110 k$\Omega$) and is connected with a DC voltage source and a gate contact of a transistor 20. Such radio frequency switches are e.g. used in radio frequency front ends of cellular phones.

A resistive polysilicon trace 2 (i.e. a trace having characteristics of a resistor and being at least partially made of polysilicon, also named polycrystalline silicon or poly-Si) of the radio frequency resistor element 1 is located above the isolation components 3 of a plurality of isolation components 3. Each of the plurality of isolation components 3 is laterally surrounded by a respective modified semiconductor region 5. The isolation components 3 are realized in the shown embodiment based on shallow trench isolations. In a different embodiment, the isolation components 3 comprise, for example, Deep-Trench-Isolations or a Field-oxide (FOX) generated by a LOCOS (Local oxidation of silicon) process.

The layer with the modified semiconductor regions 5 rests on a semiconductor substrate 4 which comprises silicon in the shown embodiment. The semiconductor substrate 4 has a high resistance in the region of about 1 k$\Omega$cm. The semiconductor substrate 4 is here given by bulk silicon. In different embodiments, the semiconductor substrate 4 is realized using, for example, SOI (Silicon-on-Insulator), GaAs (Gallium arsenide) or GaN (Gallium Nitride). In the shown embodiment, the isolation components 3 reach into the semiconductor substrate 4. In a different—not shown embodiment—the isolation components 3 end right above the semiconductor substrate 4.

The modified semiconductor regions 5—in the shown embodiment laterally completely, i.e. completely in the lateral direction—surround the isolation components 3 along a part of an axial extension of the isolation components 3 (i.e. an axial part or section of the isolation components 3). The axial direction is the longitudinal axis of the isolation components 3 reaching from a top end carrying the resistive polysilicon trace 2 to the semiconductor substrate 4. The axial part of the isolation components 3 laterally surrounded by the modified semiconductor regions 5 starts in the shown embodiment at the top end and ends at the level of the end sections of the isolation components 3 that are located within the semiconductor substrate 4. Hence, the end sections of the isolation components 3 are free from the modified semiconductor regions 5. In a different embodiment, the entire axial extension of the isolation components 3 is surrounded by the modified semiconductor regions 5.

In other words, the radio frequency resistor element 1 of the shown embodiment comprises a stack of two layers: a first layer with modified semiconductor regions 5 and a second layer of a semiconductor substrate 4. The resistive polysilicon trace 2 is located on a—in the drawing upper—surface region of the stack of semiconductor layers. A plurality of isolation components 3 is located below the resistive polysilicon trace 2. In one embodiment, the isolation components 3 are completely formed within the first layer (also called modified semiconductor layer) together with the modified semiconductor regions 5. In another embodiment, the isolation components 3 extend from the first layer into the second layer of semiconductor substrate 4. The isolation components 3 are laterally surrounded within the same, first layer by modified semiconductor regions 5. Below this first layer follows the second layer of semiconductor substrate 4 as a basis of the radio frequency resistor element 1. In an embodiment, the modified semiconductor regions 5 comprise the same material as the semiconductor substrate 4 and differ from the semiconductor substrate 4 by a modification which provides them with more recombination centers than the semiconductor substrate 4.

The modified semiconductor regions 5 comprise a higher charge carrier (charge carriers are holes or electrons) recombination rate than the semiconductor substrate 4. This feature is e.g. due to an increased number of recombination centers for the free current carriers. In an embodiment, the modification is done by adding a damage implantation to a suitable material.

The modified semiconductor regions 5 act as a recombination layer. As a result, all free electrons and holes in a certain distance to the damage implantation are recombined. This results in a depletion zone and happens, e.g., below the isolation components 3 of the resistive polysilicon trace 2.

Without the modified semiconductor regions 5, a layer of charge carriers (i.e. holes or electrons depending on the doping, oxide charges and voltage conditions) is located under the isolation components 3 of the resistive polysilicon trace 2. If the radio frequency resistor element 1 is e.g. part of a radio frequency switch, due to the radio frequency voltage swing at the resistive polysilicon trace 2 and the semiconductor substrate 4, the free charge carriers are moving periodically under the isolation components 3. This results in a periodic change of parasitic capacitances and finally in a harmonic generation in the transistor of the radio frequency switch. In contrast to this, the modified semiconductor regions 5 cause depletion regions. Hence, if the described radio frequency resistor element 1 is used within a radio frequency switch, then the generation of harmonics is reduced.

In an embodiment, the modified semiconductor regions 5 comprise active silicon with the mentioned damage implantation. In a further embodiment, the modified semiconductor regions 5 have an argon and/or a germanium damage implantation causing a silicon amorphization. According to different embodiments, the modified semiconductor regions 5 comprise damaged silicon and/or polysilicon. In an alternative or additional embodiment, the modified semiconductor regions 5 comprise strained silicon nitride causing dislocations of the silicon material.

Figure 2:
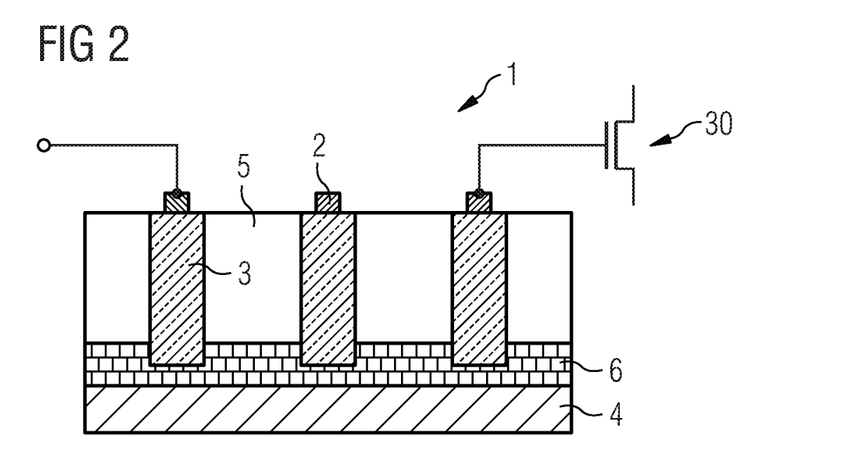
FIG. 2 shows a schematic section of a second embodiment of a radio frequency resistor element as a part of a radio frequency switch.

FIG. 2 shows a second embodiment of a radio frequency resistor element 1 with an additional modified semiconductor layer 6. The additional modified semiconductor layer 6 is located between the modified semiconductor regions 5 and the semiconductor substrate 4, i.e. between the first and second layer as defined above. In an embodiment, the modified semiconductor regions 5 and the additional modified semiconductor layer 6 comprise the same material as the semiconductor substrate 4 and differ from the semiconductor substrate 4 by at least one of the mentioned modifications. In the shown embodiment, the additional modified semiconductor layer 6 is also partially located between the isolation components 3 and the semiconductor substrate 4 as the additional modified semiconductor layer 6 surrounds the end sections of the isolation components 3.

The modified semiconductor regions 5 and the additional modified semiconductor layer 6, both, have a higher charge carrier recombination rate than the semiconductor substrate 4. The effect of the modified semiconductor regions 5 is increased by the additional modified semiconductor layer 6 between the isolation components 3 and the semiconductor substrate 4 as the isolation components 3, thus, are—with exception of the region carrying the resistive polysilicon trace 2—embedded within modified semiconductor material that has more recombination centers than the semiconductor substrate 4.

In an embodiment of the manufacture of the radio frequency resistor element 1, the additional modified semiconductor layer 6 is produced before the layer comprising the isolation components 3 and the modified semiconductor regions 5. In another embodiment, the semiconductor substrate 4, the additional modified semiconductor layer 6 and the modified semiconductor regions 5 are fabricated using the same material and the damage is added afterwards as a modification to obtain the modified semiconductor regions 5 and the additional modified semiconductor layer 6, respectively.

The modification of additional modified semiconductor 6 is done in an embodiment by a high dose and high energy implantation (for example Ar or Ge) through the isolation components 3 and the modified semiconductor regions 5 resulting in amorphization of the semiconductor material under the isolation components 3 and the modified semiconductor regions 5. This implantation is done before depositing the resistive polysilicon trace 2 to prevent a damage of the resistive polysilicon trace 2. During subsequent process steps necessary to produce the whole integrated circuit, i.e. the radio frequency resistor element 1, this amorphization is partially recrystallized. For this reason the modification of modified semiconductor regions 5 is preferred to be done after the deposition of the resistive polysilicon trace 2. At the end of the chip production a high defect density is remaining in the modified semiconductor regions 5 and the additional modified semiconductor 6. These defects act as recombination centers for the charge carriers. Another way of production is the incorporation of polycrystalline silicon in the modified layers. Here the defects in the polycrystalline structure act directly as recombination centers.

Figure 3:
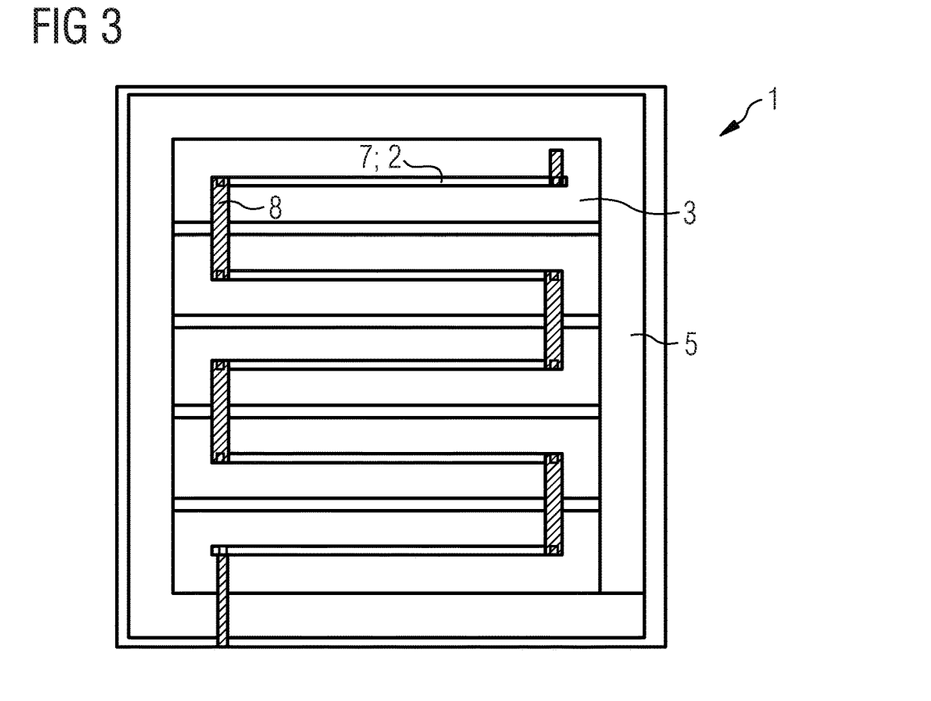
FIG. 3 provides a top view of an embodiment of a radio frequency resistor element.

In FIG. 3 a top view of the upper main surface region of an embodiment of the radio frequency resistor element 1 is shown. The upper surface region carries the resistive polysilicon trace 2 and is opposite to the—not shown—lower surface region given by the semiconductor substrate 4.

The resistive polysilicon trace 2 comprises five trace elements 7 having straight forms and being connected with each other by metal interconnectors 8 at their end regions. The metal interconnectors 8 are in a not shown embodiment located within a metal stack above the trace elements 7 and are connected with the trace elements 7 by vias. The trace elements 7 are such designed and arranged that the resistive polysilicon trace 2 has a meandering or generally folded form.

Each trace element 7 is located above a respective isolation component 3 being here a shallow trench isolation. The isolation components 3 are separated by the modified semiconductor regions 5 and are laterally surrounded by the modified semiconductor regions 5. Further, the modified semiconductor region 5 also surrounds at the outer edges all isolation components 3. Thereby, each isolation component 3 is located within a rectangular given by the modified semiconductor regions 5.

In the shown embodiment, the modified semiconductor region 5 at the top of FIG. 3 has a length of 13 µm and the trace elements 7 have a length of 10 µm. The thickness of a trace element 7 is 0.2 µm. The distance between two modified semiconductor regions 5—in the drawing above and below a trace element 7—is 1.9 μm. The resistance value of the radio frequency resistor element 1 is limited by a minimal width of the trace elements 7, a minimal doping and a maximum length of the trace elements 7.

Figure 4:
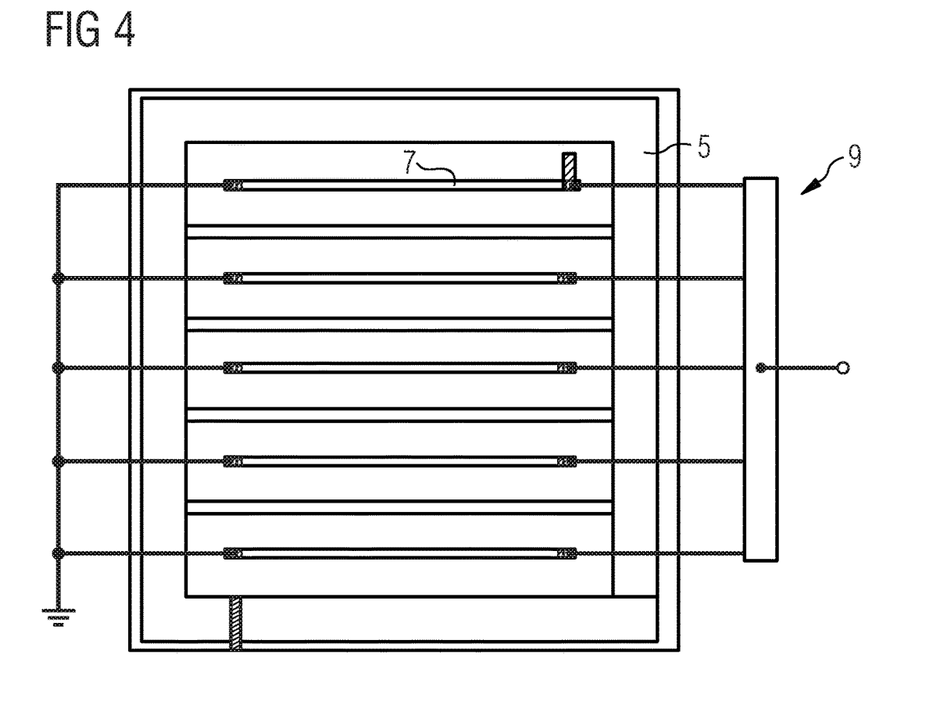
FIG. 4 shows a top view of a different embodiment of a radio frequency resistor element.
Figure 5:
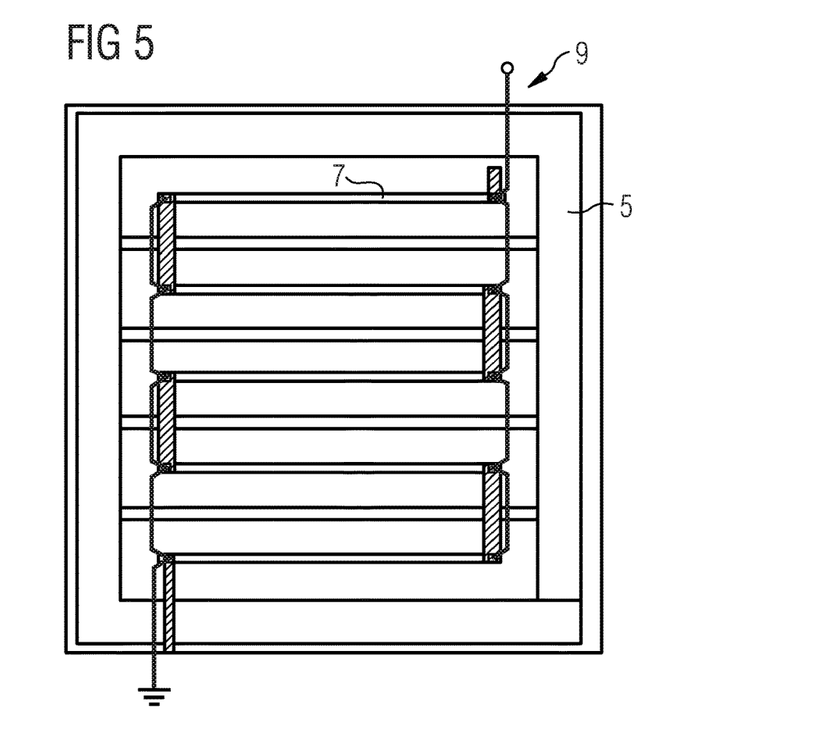
FIG. 5 gives a top view of another embodiment of a radio frequency resistor element.

The following Figure s 4 and 5 show embodiments with different possibilities of connecting the trace elements 7 leading to different resistance values of the radio frequency resistor element 1. In both embodiments, a connector element 9 allows different connections between the trace elements 7.

In FIG. 4, all trace elements 7 are free from a metal connection between each other. The metal interconnectors shown in FIG. 2 are not present. At one end, each trace element 7 is connected—in the shown exemplary embodiment in which the radio frequency resistor element 1 is used as a load resistance—with ground and the respective other end is connected with the connector element 9 which allows to connect a chosen number of trace elements 7 in order to obtain the desired resistance value of the radio frequency resistor element. In a different—not shown—embodiment, one end of the trace elements 7 is connected with the connector element 9 and the other end of the trace elements 7 is connected with another component or a voltage source etc.

The trace elements 7 of the embodiment shown in FIG. 5 are connected in parallel as one end of the trace elements 7 is connected with ground and the other ends are connected with a joint contact. Hence, the connector element 9 is here given by a fixed connection between the trace elements 7. Generally, connecting the trace elements 7 in parallel has the benefit of a spread arrangement enabling a spread of the heat.

Figure 6:
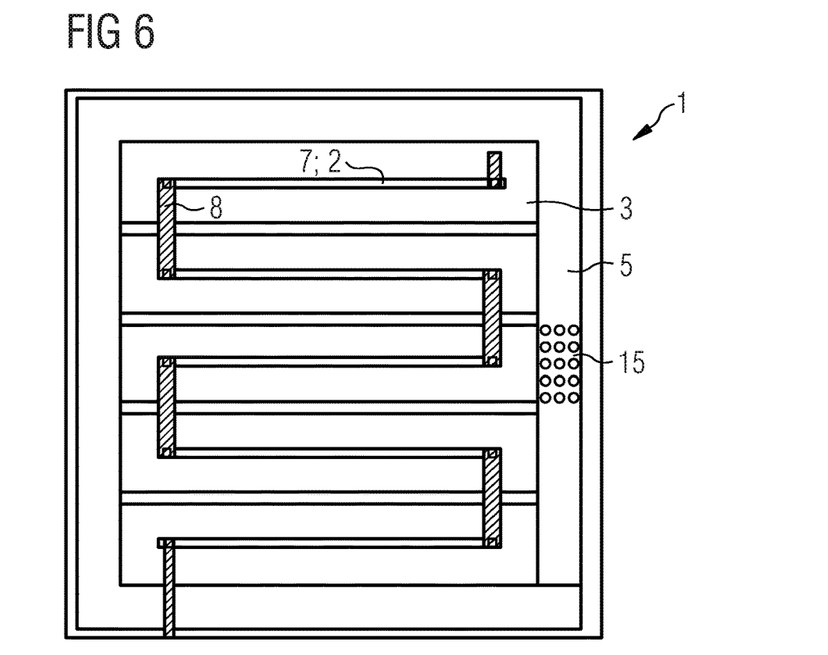
FIG. 6 gives a top view of a further embodiment of a radio frequency resistor element.

The lateral surrounding of the isolation components 3—along the part of the axial extension of the isolation components 3 discussed with regard to FIG. 1—by the modified semiconductor regions 5 is complete in the embodiments shown in FIGS. 1 to 5. In a different embodiment shown in FIG. 6, an isolation component 3 is laterally just partially surrounded by the modified semiconductor regions 5. Here, along a side of the isolation component 3 a semiconductor component 15, i.e. a semiconductor region without a modification, is given.

Figure 7:
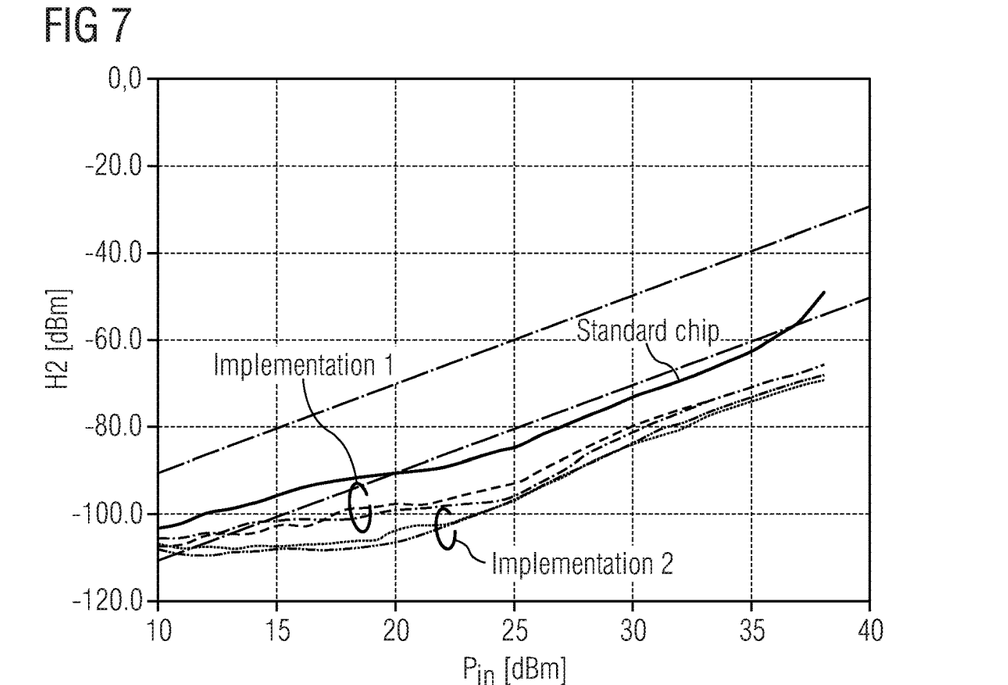
FIG. 7 shows results of measurements of second harmonics with radio frequency switches comprising different embodiments of a radio frequency resistor element during an on state of the transistor.
Figure 8:
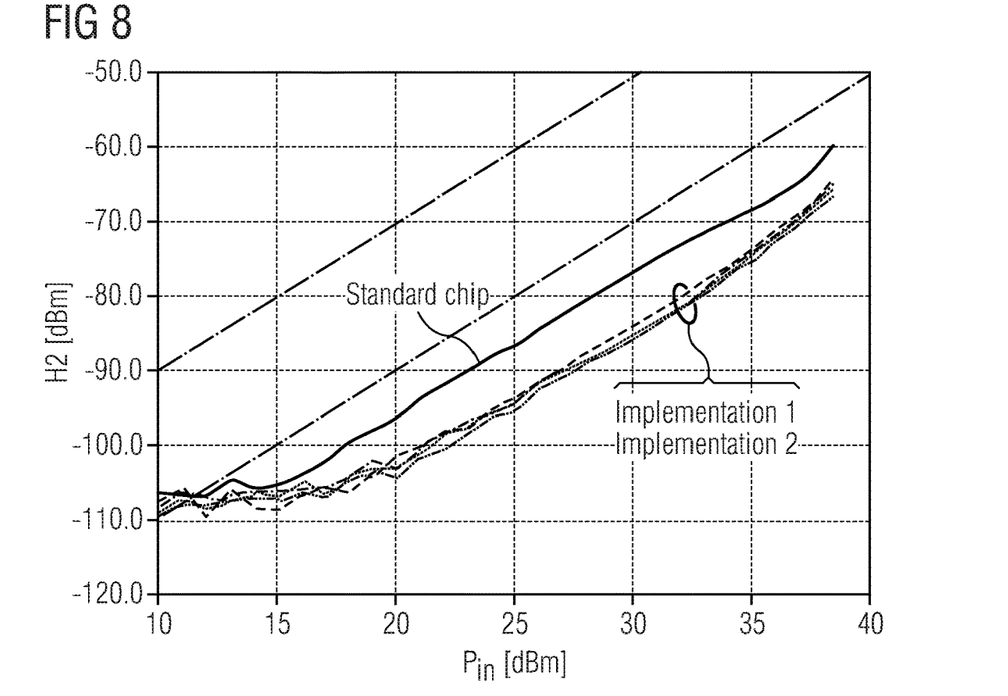
FIG. 8 shows results of measurements of second harmonics during an off state of the transistor.
Figure 9:
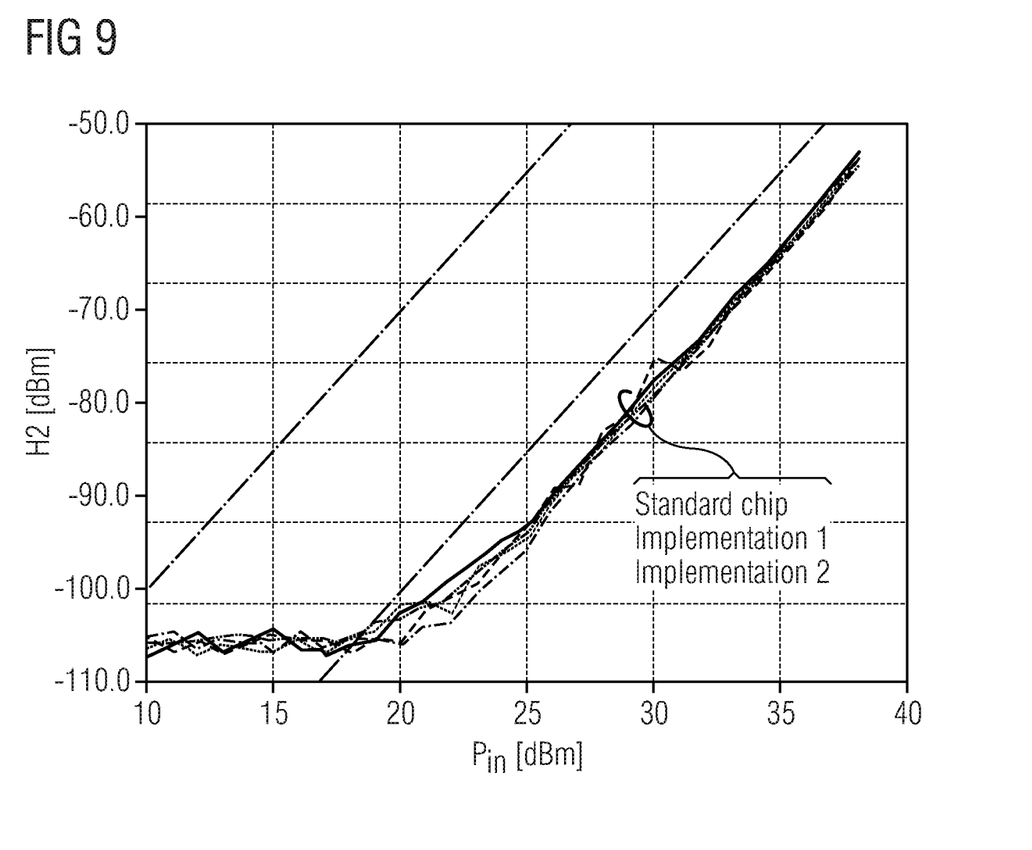
FIG. 9 shows results of measurements of third harmonics during an off state of the transistor.

In FIGS. 7 to 9, results of measurements are shown performed with three different radio frequency switches:

"Standard chip" refers to a radio frequency switch with a radio frequency resistor element without any modified semiconductor region or any additional modified semiconductor layer.

"Implementation 1" refers to a radio frequency switch with a radio frequency resistor element having modified semiconductor regions surrounding laterally at least a part of the isolation components where the modified semiconductor regions are located directly atop the semiconductor substrate (compare FIG. 1).

"Implementation 2" refers to a radio frequency switch with a radio frequency resistor element having modified semiconductor regions surrounding laterally at least a part of the isolation components and an additional modified semiconductor layer located over the semiconductor substrate (compare FIG. 2).

FIGS. 7 and 8 show measurements of the second harmonic (H2) with an on state (FIG. 7) and an off state of the transistor of the radio frequency switch (FIG. 8). Results of measurements of the third harmonic (H3) with an off state of the transistor is shown in FIG. 9. The on and off state refer to the usage of the transistor as a switch that is either closed (on state) or opened (off state). Measured was the power of the second harmonic (H2) or the third harmonic (H3) in dBm (decibel-milliwatts) depending on the input power (pin) in dBm.

The three figures demonstrate the positive effect of the Implementation 1 and 2 in comparison to the standard chip. It can be seen that Implementation 1 and 2 are better than the standard chip with regard to the second harmonic in the on and in the off state (FIGS. 7 and 8). For the third harmonic which is less important than the second harmonic, Implementation 1 and 2 are comparable to the standard chip for the off state (FIG. 9). Further, it can also be seen (especially in FIG. 7) that the Implementation 2 with the additional modified semiconductor layer reduces the harmonics even more. Hence, the behavior of the radio frequency switch is more linear with Implantation 1 and 2, i.e. with adding a modification to the semiconductor material around (Implantation 1, see FIG. 1) or around and below (Implementation 2, see FIG. 2) the isolation components.

In accordance with a first aspect, a radio frequency resistor element may comprise: a resistive polysilicon trace, an isolation component and a semiconductor substrate, wherein the resistive polysilicon trace is located above the isolation component, wherein the isolation component is laterally at least partially surrounded by a modified semiconductor region, wherein the modified semiconductor region is located above the semiconductor substrate, and wherein the modified semiconductor region has a higher charge carrier recombination rate than the semiconductor substrate.

In accordance with a second aspect when referring back to the first aspect, in the radio frequency resistor element the modified semiconductor region may laterally surround at least a part of an axial extension of the isolation component.

In accordance with a third aspect when referring back to the first aspect, in the radio frequency resistor element the modified semiconductor region may comprise an active silicon that comprises a damage implantation.

In accordance with a fourth aspect when referring back to the first aspect, in the radio frequency resistor element the modified semiconductor region may comprise an argon implantation.

In accordance with a fifth aspect when referring back to the first aspect, in the radio frequency resistor element the modified semiconductor region may comprise a germanium implantation.

In accordance with a sixth aspect when referring back to the first aspect, in the radio frequency resistor element the modified semiconductor region may comprise damaged silicon.

In accordance with a seventh aspect when referring back to the first aspect, in the radio frequency resistor element the modified semiconductor region may comprise polysilicon.

In accordance with an eighth aspect when referring back to the first aspect, in the radio frequency resistor element the modified semiconductor region may comprise strained silicon nitride.

In accordance with a ninth aspect when referring back to the first aspect, in the radio frequency resistor element the isolation component may comprise a shallow trench isolation.

In accordance with a tenth aspect when referring back to the first aspect, the radio frequency resistor element may further comprise an additional modified semiconductor layer, wherein the additional modified semiconductor layer may be located between the isolation component and the semiconductor substrate, and wherein the additional modified semiconductor layer may have a higher charge carrier recombination rate than the semiconductor substrate.

In accordance with an eleventh aspect when referring back to the first aspect, the radio frequency resistor element may further comprise an additional modified semiconductor layer, wherein the additional modified semiconductor layer may be located between the modified semiconductor regions and the semiconductor substrate, and wherein the additional modified semiconductor layer may have a higher charge carrier recombination rate than the semiconductor substrate.

In accordance with a twelfth aspect when referring back to the first aspect, in the radio frequency resistor element the resistive polysilicon trace may have a meandering form or folded form.

In accordance with a thirteenth aspect when referring back to the first aspect, in the radio frequency resistor element the resistive polysilicon trace may comprise a plurality of trace elements, wherein each of the plurality of trace elements is located above a respective isolation component, and wherein each isolation component is laterally at least partially surrounded by a modified semiconductor region.

In accordance with a fourteenth aspect when referring back to the thirteenth aspect, in the radio frequency resistor element each of the plurality of trace elements may have a straight form.

In accordance with a fifteenth aspect when referring back to the thirteenth aspect, in the radio frequency resistor element the plurality of trace elements may be connected by metal interconnectors with each other.

In accordance with a sixteenth aspect when referring back to the thirteenth aspect, the radio frequency resistor element may further comprise a connector element, and the connector element may be configured to connect the plurality of trace elements in series.

In accordance with a seventeenth aspect when referring back to the thirteenth aspect, the radio frequency resistor element may further comprise a connector element, and the connector element may be configured to connect the plurality of trace elements in parallel.

In accordance with an eighteenth aspect when referring back to the first aspect, in the radio frequency resistor element the semiconductor substrate may comprise silicon.

In accordance with an nineteenth aspect when referring back to the first aspect, in the radio frequency resistor element the resistive polysilicon trace may be connected with a transistor of a radio frequency switch.

As the description refers to illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A radio frequency resistor element, comprising:
   a resistive polysilicon trace;
   an isolation component; and
   a semiconductor substrate,
      wherein the resistive polysilicon trace is located above the isolation component,
      wherein the isolation component is laterally at least partially surrounded by a modified semiconductor region,
      wherein the modified semiconductor region is located above the semiconductor substrate,
      wherein the modified semiconductor region has a higher charge carrier recombination rate than the semiconductor substrate,
      wherein the resistive polysilicon trace comprises a plurality of individual parallel trace elements in a plan view,
      wherein each of the plurality of trace elements is located above a respective isolation component, and
      wherein each isolation component is laterally completely surrounded by the modified semiconductor region.

2. The radio frequency resistor element of claim 1, wherein the modified semiconductor region laterally surrounds at least a part of an axial extension of the isolation component.

3. The radio frequency resistor element of claim 1, wherein the modified semiconductor region comprises an active silicon that comprises a damage implantation.

4. The radio frequency resistor element of claim 1, wherein the modified semiconductor region comprises an argon implantation.

5. The radio frequency resistor element of claim 1, wherein the modified semiconductor region comprises a germanium implantation.

6. The radio frequency resistor element of claim 1, wherein the modified semiconductor region comprises damaged silicon.

7. The radio frequency resistor element of claim 1, wherein the modified semiconductor region comprises polysilicon.

8. The radio frequency resistor element of claim 1, wherein the modified semiconductor region comprises strained silicon nitride.

9. The radio frequency resistor element of claim 1, wherein the isolation component comprises a shallow trench isolation.

10. The radio frequency resistor element of claim 1,
    wherein the radio frequency resistor element further comprises an additional modified semiconductor layer,
    wherein the additional modified semiconductor layer is located between the isolation component and the semiconductor substrate, and
    wherein the additional modified semiconductor layer has a higher charge carrier recombination rate than the semiconductor substrate.

11. The radio frequency resistor element of claim 1,
    wherein the radio frequency resistor element further comprises an additional modified semiconductor layer,
    wherein the additional modified semiconductor layer is located between the modified semiconductor regions and the semiconductor substrate, and
    wherein the additional modified semiconductor layer has a higher charge carrier recombination rate than the semiconductor substrate.

12. The radio frequency resistor element of claim 1, wherein the resistive polysilicon trace has a meandering form or folded form.

13. The radio frequency resistor element of claim 1, wherein each of the plurality of trace elements has a straight form.

14. The radio frequency resistor element of claim 1, wherein the plurality of trace elements are connected by metal interconnectors with each other.

15. The radio frequency resistor element of claim 1,
    wherein the radio frequency resistor element further comprises a connector element, and wherein the connector element is configured to connect the plurality of trace elements in series.

16. The radio frequency resistor element of claim 1, wherein the radio frequency resistor element further comprises a connector element, and
wherein the connector element is configured to connect the plurality of trace elements in parallel.

17. The radio frequency resistor element of claim 1, wherein the semiconductor substrate comprises silicon.

18. The radio frequency resistor element of any of claim 1, wherein the resistive polysilicon trace is connected with a transistor of a radio frequency switch.

19. A semiconductor circuit comprising:
an isolation trench;
a damaged silicon region laterally completely surrounding the isolation trench, the damaged silicon region having a higher charge carrier recombination rate than an undamaged semiconductor substrate disposed below the isolation trench and the damaged silicon region;
a resistive polysilicon trace disposed above the isolation trench; and
a connector element coupled to the resistive polysilicon trace,
wherein the resistive polysilicon trace comprises a plurality of individual parallel trace elements in a plan view, wherein each of the plurality of trace elements is located above a respective isolation trench, and wherein each isolation trench is laterally completely surrounded by the damaged silicon region.

20. The semiconductor circuit of claim 19, further comprising a transistor coupled to the connector element.

* * * * *